United States Patent [19]
Orban

[11] 4,412,100
[45] Oct. 25, 1983

[54] MULTIBAND SIGNAL PROCESSOR
[75] Inventor: Robert A. Orban, Belmont, Calif.
[73] Assignee: Orban Associates, Inc., San Francisco, Calif.
[21] Appl. No.: 303,789
[22] Filed: Sep. 21, 1981
[51] Int. Cl.³ .......................... H04B 1/66; H04M 1/00
[52] U.S. Cl. ...................................... 381/100; 381/186
[58] Field of Search ...... 179/1 VL, 15.55 R, 15.55 T, 179/1 D, 1 P; 307/543

[56] References Cited
U.S. PATENT DOCUMENTS
4,208,548  6/1980  Orban ................................. 179/1 P
4,249,042  2/1981  Orban ........................... 179/15.55 R Primary Examiner—G. Z. Rubinson
Assistant Examiner—James L. Dwyer
Attorney, Agent, or Firm—Blakely, Sokoloff, Taylor & Zafman

[57] ABSTRACT

A multiband analog audio processor is described which provides low peak-to-r.m.s. ratios. A distributed crossover configuration is described which, in the presently preferred embodiment, employs bandpass filters with embedded clippers for high frequency processing. Circuits for improved distortion performance of the distributed crossover configuration is also described. An economical series/parallel crossover configuration with favorable summation properties is also set forth.

36 Claims, 7 Drawing Figures

ALLPASS FILTER

MULTIBAND SIGNAL PROCESSOR

BACKGROUND OF THE INVENTION

1. Field of the Invention

The invention relates to the field of signal processing, particularly audio signal processing.

2. Prior Art

Numerous systems are commercially available and otherwise known for processing audio signals prior to transmission or recording. In most cases, these systems are used to reduce the peak-to-r.m.s. ratio of audio signals. A lower ratio provides greater loudness and coverage for given limitations of carrier power. Simultaneously, it is desirable to avoid the audible side effects associated with more conventional audio signal processing. The prior art section of U.S. Pat. No. 4,208,548 discusses these side effects and other limitations of prior art processing methods.

U.S. Pat. No. 4,208,548 describes a variable-gain (VCA) amplifier used in conjunction with a clipper. Complex psychoacoustical calculations are described for controlling the gain of the VCA to prevent the clipper distortion from being detectable. Unnatural gain and loudness variations sometimes result in this system because the VCA gain needed to reduce clipping distortion to an undetectable level is so small that the ear perceives the loudness as being reduced in an unnatural way. In more conventional processing, this phenomena is sometimes referred to as "pumping". As will be seen, the present invention provides a substantial improvement over the processing techniques described in the abovementioned patent.

It is well-known that multiband compressors can cure many of the problems associated with wideband compressors. This topic is addressed in U.S. Pat. No. 4,249,042. There have been some unsuccessful attempts to employ multiband clipping in addition to multiband compression. And as a result of these attempts, it is known that if this clipping is done in an obvious way (one clipper after each compressor in a multiband compressor) that distortion builds up even faster than it does when a single clipper is used. Thus, for the most part, the prior art has used multiband compression without clipping or systems employing wideband clipping.

The present invention, as will be discussed, provides an apparatus for multiband clipping which results in substantially lower perceived distortion than a system employing a single clipper. In practice, the output of the invented processor (which includes multiband compression) can be directly applied to a final wideband clipper on virtually all program material without objectionable distortion. The more complex psychoacoustical calculations described in U.S. Pat. No. 4,208,548 are eliminated. The invented system provides improved naturalness and greater simplicity (at a lower cost). The new multiband processing of the present invention uses an extension of the distortion-cancellation apparatus disclosed in U.S. Pat. No. 4,208,548. Additionally, the present invention extends the concept described in U.S. Pat. No. 4,249,042, in particular, FIG. 4 and the circuitry associated with clipper 71.

The present invention makes use of a distributed allpass crossover method. Some theories on such a system are described in "All-Pass Crossover Systems" *Journal of the Audio Engineering Society*, September, 1980, Vol. 28, No. 9, beginning at page 575, by Peter Garde.

SUMMARY OF THE INVENTION

In its presently preferred embodiment, the signal processor can generally be described as a distributed crossover system for use with bandpass filters containing internal (embedded) clippers. A unique (series/parallel) crossover configuration with favorable summation of properties is used. Also described is a means for improving the distortion performance of the "distributed" crossover configuration (or, conceivably, other configurations using clipping or nonlinear processing) by summing the various crossover frequency bands into a distortion-cancelling filter of the type disclosed in U.S. Pat. No. 4,208,548.

In one of its embodiments, the present invention includes a first and second lowpass filter, each having a cutoff frequency of $f_1$. In this context, "$f_1$" is the frequency at which the filter is down 3 dB. In the case of distributed filters, like the cascade of 11 and 17 in FIG. 3, $f_1$ is the frequency where the combined response of filters 11 and 17 is down 3 dB. A first signal processor is disposed between these filters. This processor may include a compressor and a clipper. A third highpass filter also having a cutoff frequency approximately equal to $f_1$ is coupled to the input of the first filter and a second signal processor is coupled in series with this highpass filter. The output of the second processor and the second lowpass filter are combined in a first combining means. A fourth and fifth lowpass filter each having a cutoff frequency of $f_2$ are connected, one in series with the input of the filter filter and the other in series with the output of the first combining means. A sixth highpass filter with a cutoff frequency approximately equal to $f_2$ is connected to the input of the fourth filter. The output of this highpass filter is connected to an allpass filter having a center frequency approximately equal to $f_1$. The output of the allpass filter (which may be coupled through another signal processor) is combined with the signal from the fifth lowpass filter. In this manner, effective multiband signal processing is achieved.

DETAILED DESCRIPTION OF THE INVENTION

A processor particularly suitable for audio processing is described. The presently preferred embodiment of the processor is used to provide low peak-to-r.m.s. signal ratios for an audio signal, and thus, provides better loudness for radio broadcasting. In the following description, numerous specific details are set forth such as specific frequencies, etc., in order to provide a thorough understanding of the present invention. It will be obvious, however, to one skilled in the art that the present invention may be practiced without these specific details. In other instances, well-known circuits are illustrated in block diagram form in order not to obscure the present invention in unnecessary detail.

GENERAL DISCUSSION OF FIGURE 3

Figure 1:
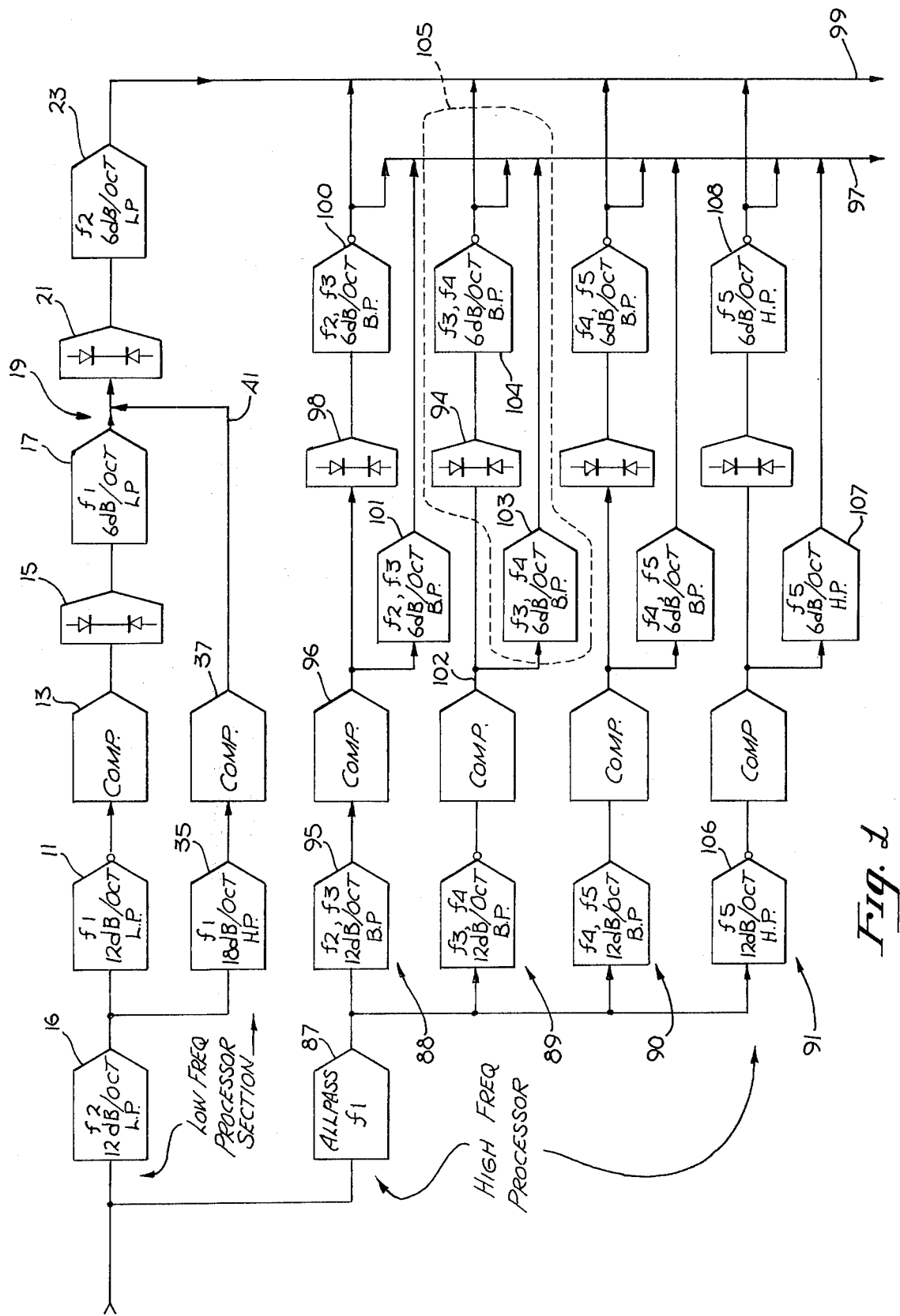
FIG. 1 is a circuit diagram of the presently preferred embodiment of the invention; it illustrates a 6-band distributed-crossover processor with embedded clippers.
Figure 3:
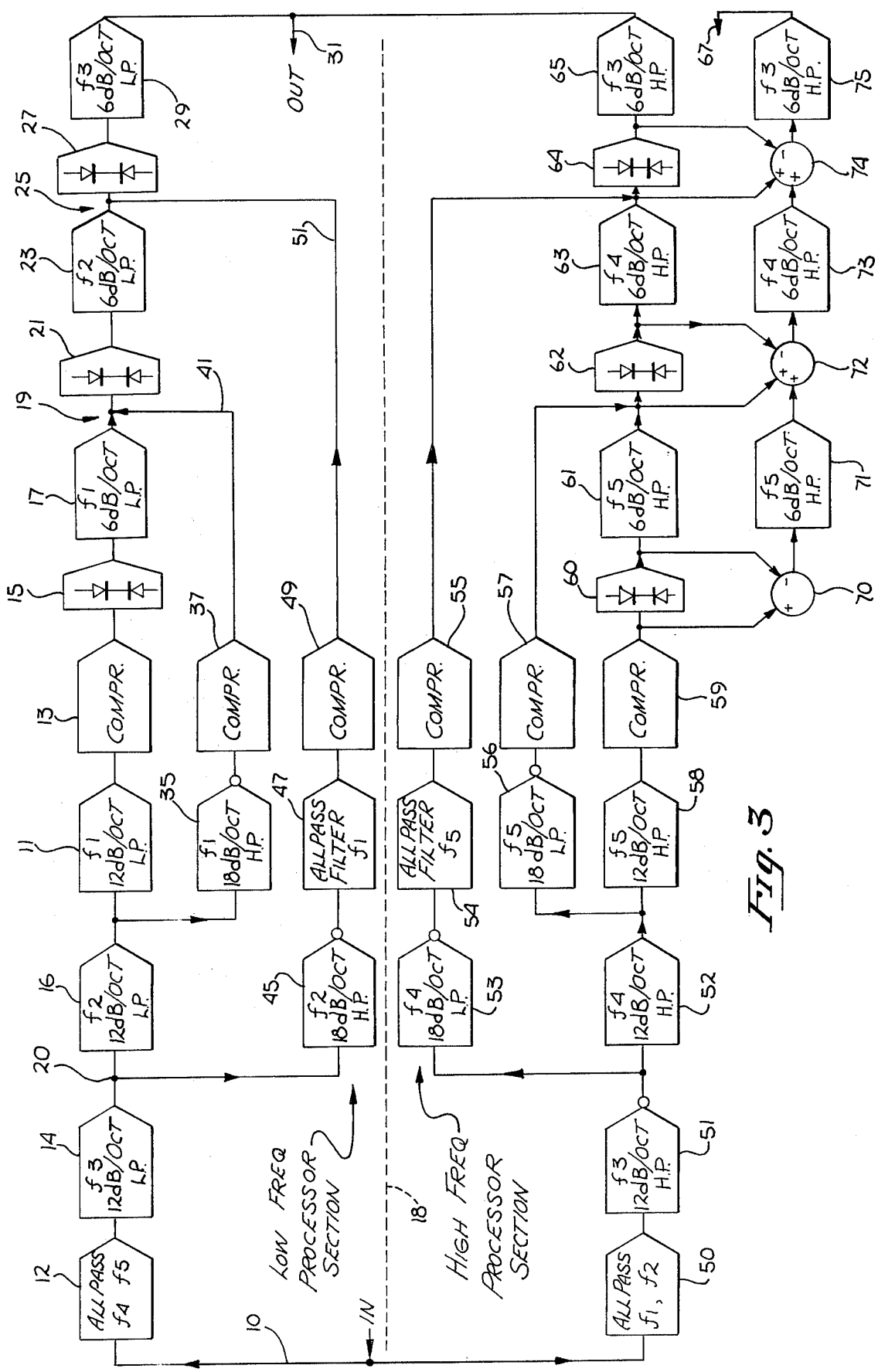
FIG. 3 is a circuit diagram illustrating an embodiment of the present invention. This embodiment is illustrated since it more readily enables an understanding of the present invention.

Referring first to FIG. 3, an audio processor is shown which includes a low frequency processor section (above dotted line 18) and a high frequency processor section (below line 18). An audio input signal is applied to line 10. An output signal is received on line 31. Typically, this processor and the processor of FIG. 1 are used in the audio processing section of a broadcasting system. The invented processor may be used with other processing equipment such as a multiband compressor, preemphasis network, overshoot protection circuit, etc. The embodiment of FIG. 3 is first discussed below since its topography more closely matches the theoretical operation of the invention. As will be seen, when all the compressors of the processor such as compressors 13, 37 and 49 have equal gains, then the frequency response between lines 10 and 31 is flat, however, the processor has a nonlinear delay. Thus, the entire processor can be considered an allpass filter when all compressors have equal gain.

Because of characteristics of the human ear, it is desirable to separate a crossover processor into two sections, a low frequency section and a high frequency section. This is done in FIG. 3 without violating the allpass nature of the entire processor. One reason for treating the low frequencies and high frequencies differently lies in the fact that clippers are embedded between various filtering means in the system. For example, note that clipper 15 is disposed between the filters 11 and 17.

An examination of FIG. 3 will show that the input to each clipper is band-limited by prior filtering. These clippers, when active, produce distortion components both above and below the frequency band of the clipper input signal. In the case of the low frequency processor, it is desirable to suppress the higher frequency distortion components. These components fall in the frequency range most sensitive to the human ear as can be seen by examining the Fletcher-Munson curves of equal loudness. For example, if the dominant frequency band applied to a given clipper is 200 Hz, then distortion components (both harmonic and intermodulation) will be produced in a frequency range above 200 Hz. The sensitivity of the ear falls off rapidly below 200 Hz, so the ear will be particularly sensitive to the above-200 Hz distortion. At the same time, receiver deemphasis (which will almost certainly be used in practice and for example, is mandatory for FM broadcasting) is usually not applied below 200 Hz, so no reduction in distortion due to preemphasis will occur.

In the case of the high frequency processor, the situation is reversed. Distortion components produced by clipping are far more offensive below the clipper's input frequency band since the distortion components above the clipper's input frequency band are rolled off by de-emphasis, and also since the sensitivity of the ear decreases at very high frequencies. (The ear is most sensitive between 1 kHz and 3 kHz.) On the other hand, the difference-frequency intermodulation which produces the distortion below the input frequency band of the given clipper is effectively exaggerated by the de-emphasis. This is because the distortion is not rolled off, whereas the desired signal and the high frequency distortion components are rolled off. Difference-frequency intermodulation is thus a major concern in the high frequency case, and it is necessary for the high frequency processor to reduce this low frequency distortion as much as possible.

As will be seen, one of the differences between the low frequency and high frequency processing sections of FIG. 3 is that the low frequency section minimizes its higher frequency distortion while the high frequency section minimizes its low frequency distortion. This is also true for the embodiment of FIG. 1.

GENERAL OPERATION OF FIG. 3

The circuit of FIG. 3 provides in a general way an allpass (i.e., flat-summed) crossover network with an arbitrary number of bands by the use of allpass crossovers as described in the Garde article. However, this is combined with corrective allpass filters (e.g., filters 47 and 54) to assure that the additional phase shift through the high frequency path of any of the allpass crossovers is equal to the phase shift in the low frequency paths. Embedded clippers exploit the properties of the crossover filters in reducing clipping distortion in the undesired frequency ranges. Specifically, the undesired range as discussed, is the high frequencies for the low frequency processor section and the low frequencies for the high frequency processor section. The signals from the high frequency section and low frequency section are phase corrected (filters 12 and 50) to preserve the allpass nature of the entire processor of FIG. 3. The low frequency distortion from the high frequency processor is further reduced through a side chain and the use of the circuit of FIG. 2.

In the following description of FIG. 3 third-order Butterworth filters (in subtractive mode) are discussed. However, it will be apparent that any of the allpass crossover networks described by Garde may be used with appropriate compensation by corrective allpass networks whose phase shift as a function of frequency is identical to the phase shift of the summed lowpass and highpass filters in the allpass crossover networks. It should be borne in mind that where third-order Butterworth filters are used in subtractive mode (e.g., filters 11, 17 and 35) compensation is obtained by use of first-order allpass networks such as by filter 47.

LOW FREQUENCY SECTION OF FIG. 3

Figure 6:
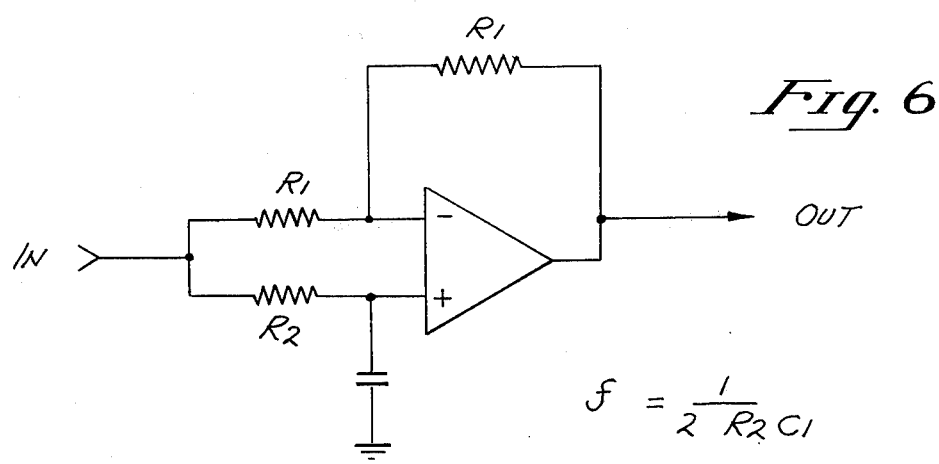
FIG. 6 is a circuit diagram showing a prior art allpass filter or frequency f; circuit is used in the present invention.

Referring now to the structure of the low frequency section of the processor of FIG. 3, the input signal is first coupled through a dual-section allpass filter 12, the sections of which exhibit a 90 degree phase shift at the frequencies $f_4$ and $f_5$. (In this application, the "center" frequency of an allpass filter refers to the frequency at which the filter exhibits a 90 degree phase shift). In the presently preferred embodiment where the lowpass and highpass filters have the characteristics of a third-order Butterworth filter, the allpass network of FIG. 6 may be employed. That is, the allpass filter of FIG. 6 provides a matching phase shift to the summation of the third order Butterworth high and lowpass filters used in the present invention, such as filter 35 (highpass), and the cascade filters 16 and 17 (lowpass) of FIG. 3.

The output of the filter 12 is coupled through a filter 14. This lowpass filter (when combined with filter 29) has a cutoff frequency $f_3$ and as shown, is a second order filter (12 dB/octave). The output of filter 14 is coupled to two paths. The upper path includes the 12 dB/octave lowpass filter 16 which has a cutoff frequency $f_2$ when combined with filter 23. The output of this filter is coupled to the upper path and also to an intermediate path. The upper path includes a 12 dB/octave lowpass filter 11 which has a cutoff frequency $f_1$ when combined with filter 17. The output of this filter is coupled to a signal processing means which in the presently preferred embodiment comprises an ordinary compressor 13 and a clipper 15. The output of the clipper 15 is coupled to a first order lowpass filter 17 which has a cutoff frequency of $f_1$ when combined with filter 11. The output of filter 17 is combined with a signal from the intermediate path at node 19. This signal at this node is coupled through a clipper 21 and onto a lowpass filter 23 which is a first order filter having a cutoff frequency of $f_2$ when combined with filter 16. The output of filter 23 is combined with the signal from the lower path at node 25. The signal is then passed through another clipper 27 and through a first order lowpass filter 29. The signal at the output of this filter when combined with the signal from the high frequency section provides the output signal on line 31.

The intermediate path includes the highpass filter 35 which is a third order filter having a cutoff frequency of $f_1$. This filter provides an inverted output when compared to the combined polarity of filters 11 and 17. A small circle at the output of filter 35 is used to indicate this inversion. The output of filter 35 is coupled through another signal processor which includes a compressor 37 and a clipper. The clipper associated with this compressor is connected after node 19. However, this clipper could be placed within line 41 instead of after node 19.

The lower path which is coupled to the output of filter 14 includes the highpass filter 45. The output from this third order filter is coupled through an allpass filter having a center frequency of $f_1$. Filter 47's output is passed through another signal processor which comprises a compressor 49 and a clipper. Once again, the clipper is placed after a summing node, (node 25). Clipper 27 could be placed within line 51.

The manner in which the low frequency processor is built up can be appreciated by assuming that an additional band is to be added. Note for the lower path, filter 45 provides 18 dB/octave of highpass filtering below $f_2$. The upper path through filters 16 and 23 provides 18 dB/octave of lowpass filtering above $f_2$. To illustrate how the number of bands in the low frequency processor could be increased, if another band were to be added to the low frequency processor for frequency $f_3$, two additional lowpass filters would be included in the uppermost path. Specifically, a filter 14 (which is already included to provide separation between the low frequency and high frequency sections), would be used. The output of the allpass network 12 would be coupled to a third order highpass filter having a cutoff frequency $f_3$ (corresponding to filter 45). The output of this filter would be coupled to a two-stage allpass filter (corresponding to allpass filter 47). This allpass filter would provide phase matching for the summation of filters 35, 11 and 17, and the summation of filters 45, 16 and 23. The output of this allpass filter would be coupled through another signal processing means and then summed with the output of filter 29. Thus, the structure shown above line 18 can be expanded to include more frequency bands.

One advantage to the structure described above which is not taught by any of the prior art is the use of filter 35 in a subtractive mode, and the splitting of the third-order Butterworth lowpass filter into filters 11 and 17 with the clipper embedded between them. The complex pole filter is located before the clipper and the simple pole filter after the clipper. The simple pole filter thus serves to roll off high frequency clipper-induced distortion. As will be seen, the converse occurs in the high frequency section.

In the operation of the low frequency section, first note that at node 19 the outputs of the lowpass filters 11 and 17, and the highpass filter 35 are summed. This summation is subtractive because of the polarity reversal in filter 35. Assume that the gains of compressors 13 and 37 are equal and that clipper 15 is inactive. The signal at node 19 is equivalent to the signal at the input of filter 11 except that the signal has been processed by the equivalent of a single order allpass filter with a 90 degree phase shift at $f_1$. This is true since third-order Butterworth filters subtractively sum to produce this result as shown in the above cited article by Garde. If the amplitude of the audio signal becomes large enough to cause clipper 15 to clip the waveform, then filter 17 will roll off the high frequency components of the clipper-induced distortion.

Figure 4:
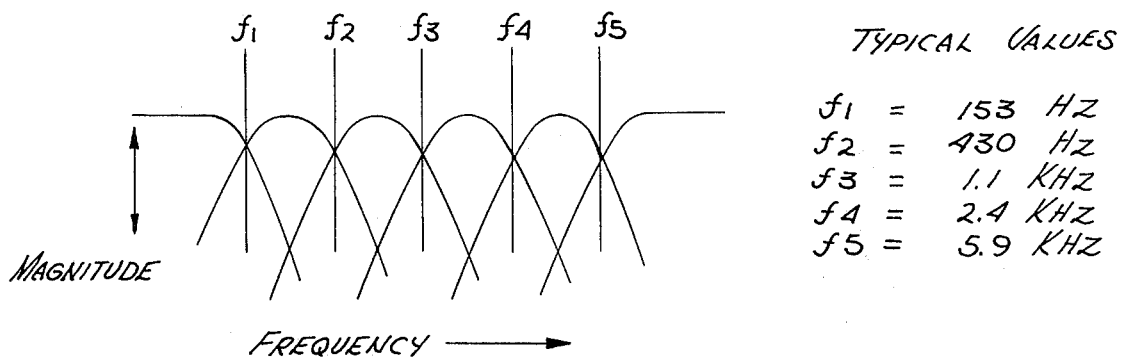
FIG. 4 is a graph illustrating typical crossover frequency bands for $f_1$ through $f_5$ of FIGS. 1 and 3.

As can be seen, the highpass filter 35 is in series with the lowpass filters 14 and 16. The output of filter 35 is thus a bandpass function, and represents the band between $f_1$ and $f_2$ as shown in FIG. 4, except for the effects of filters 23 and 29. Filters 23 and 29 further provide lowpass filtering to steepen the slope of the overall bandpass filtering function formed by the series filters 14, 16, 35, 23 and 29. As mentioned, the clipper could have been included in line 41 and the clipper 27 could have been included in line 51. The locations of the clippers as shown it has been found in practice to be best since it provides control of the peak levels of the sum of the low frequency bands, thus substantially avoiding intermodulation distortion in a final safety clipper. The peak level of the low frequency summed signals into a final wideband clipper cannot be greater than 5 dB below its clipping threshold. This provides needed head room to accommodate midrange and high frequency components of the signal without excessive clipping in the final clipper. By clipping the sum of the bands as (clippers 21 and 27 do in their shown location), the −5 dB criterion can be met despite varying amounts of signal in each of the low frequency bands.

Another advantage to the topography shown in FIG. 3 comes about from the series connected clippers 15, 21,27 and filters 17, 23 and 29. The distortion produced by clipper 15 passes through three poles of lowpass filtering before the output line 31. This maximizes the distortion reduction effect of the filtering. Similarly, the output of the clipper 21 passes through two poles of filtering. Only the output of clipper 27 passes through a single pole of filtering.

To understand the effect of the path which includes the filter 45, once again assume that all compressors have equal gain. For these conditions the paths discussed above can be replaced by a single order allpass filter having a center frequency $f_1$ as described. Using this model, it can be seen that the path which includes filter 45 is identical in structure to the abovedescribed loop with the exception that the allpass filter 47 is introduced in series with filter 45. The net result, again assuming equal gains in compressors 13, 37 and 49 is equivalent of two allpass filters of center frequencies $f_1$ and $f_2$ coupled in series. (When the signals from the lowpass filters 16 and 23 and the signal from the highpass filter 45 are summed for the Butterworth filters, the response is equivalent to an allpass filter of center frequency of $f_2$).

HIGH FREQUENCY SECTION OF FIG. 3

There is considerable symmetry between the high frequency and low frequency sections of FIG. 3. The input signal to the high frequency section (line 10) is first coupled through dual allpass filter 50 which may be two of the filters shown in FIG. 6, provided the highpass and lowpass filters are realized as third-order Butterworth filters. The two allpass filters in 50 have 90 degree phase shifts at frequencies $f_1$ and $f_2$. The output of these filters are coupled through a second order highpass filter 51 which cuts off the frequencies below $f_3$ when combined with filter 65.

As in the case of the low frequency section, there are three paths. The main path includes filters 52 and 58, compressor 59, clipper 60, filter 61, clipper 62, filter 63, clipper 64 and finally, filter 65. The middle path includes the filter 56 and compressor 57; and, the outer path includes filters 53 and 54 and the compressor 55. There is also a side chain used for distortion cancellation which has no equivalency in the low frequency section. The side chain comprises the summers 70, 72 and 74, and the filters 71, 73 and 75.

The major distinction between the high frequency and low frequency processor sections, aside from the fact that the filter frequencies are different, is the position interchanging of the lowpass and highpass filters. Note that the main path includes highpass filters whereas in the low frequency section, the main path includes lowpass filters. If the output of the compressor 59 is clipped by the clipper 60, the highpass filter 61 tends to roll off the lower frequency distortion. As mentioned for the high frequency section, it is this lower frequency distortion which is more noticeable.

As in the case of the low frequency processor, more frequency bands may be added.

The entire response of the high frequency section from the output of the filter 50 to the output of the filter 65 is equivalent to a third order Butterworth highpass filter of frequency $f_3$ in series with two allpass filters of center frequencies $f_4$ and $f_5$. As already mentioned, the entire response of the low frequency section from the output of filter 12 to the output of filter 29 is equivalent to a third order Butterworth lowpass filter of frequency $f_3$ in series with two allpass filters of frequency $f_1$ and $f_2$. Thus, a pair of allpass filters of frequency $f_4$ and $f_5$ are inserted ahead of filter 14, and a pair of allpass filters of frequency $f_1$ and $f_2$ are inserted ahead of filter 51. These additional allpass filters assure identical phase shift in the low and high frequency sections. It is therefore seen that the entire system, that is, both high frequency and low frequency processor sections is equivalent to five allpass filters of frequencies of $f_1$, $f_2$, $f_3$, $f_4$ and $f_5$ coupled in series.

The operation of the high frequency processor is quite similar to that of the low frequency processor as described above. The middle loop is equivalent to an allpass filter of frequency $f_5$, and the outer loop is equivalent to an allpass filter of frequency $f_4$ in series with an allpass filter of frequency $f_5$.

DISTORTION-CANCELLING SIDE CHAIN OF FIG. 3 USING FILTERS OF FIG. 2

One important feature of the high frequency processor section is the side chain which provides an ouput on line 67. The output of each of the clippers 60, 62 and 64 is substracted from its input by the summer 70, 72 and 74, respectively. The outputs of these summers are passed through filters 71, 73 and 75 as illustrated. These filters are used to match both the phase and amplitude responses associated with filters 61, 63 and 65 and the clipper 60, 62 and 64 of the main path. An examination of this main path and the side chain path will show that if the signal at the output of filter 65 is summed with the signal on line 67, the summation will entirely cancel the effects of clipping and whether the clippers 60, 62 and 64 are active or not, no difference will be seen in the summed signal.

Figure 2:
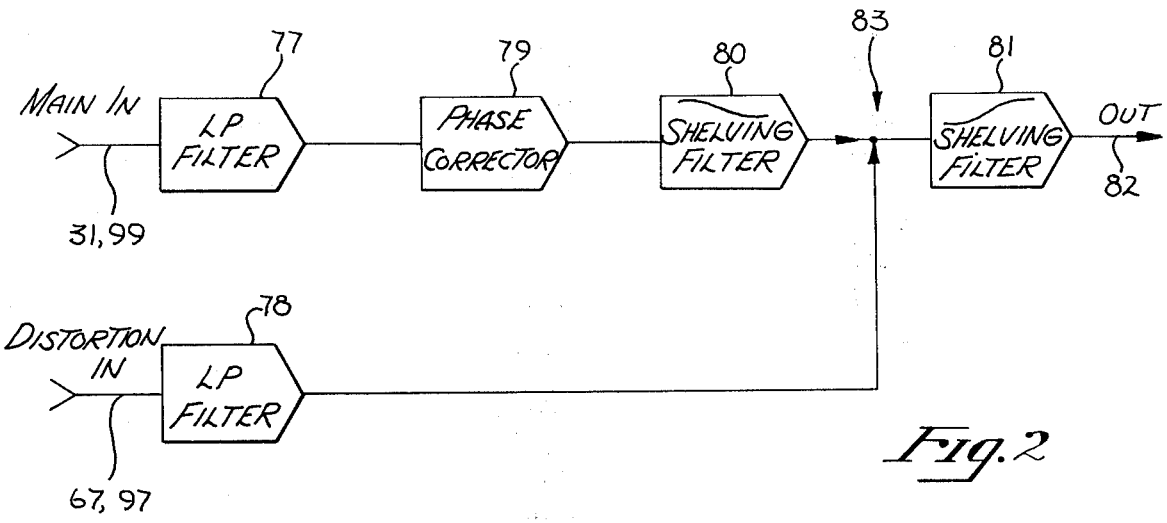
FIG. 2 is a circuit diagram of a 2-input/single-output filter used to perform a distortion-cancellation function in the present invention.

To perform the distortion-cancellation function, the circuit of FIG. 2 is employed. The signal on line 67 is coupled to the input of the lowpass filter 78, while the signal on line 31 is coupled to the input of the lowpass filter 77. A phase corrector 79 is used to make the delay of filter 77 approximately constant at all frequencies. The phase corrector 79 consists of an allpass filter whose phase response adds to the phase response of filter 77 to create a more uniform delay from the input of filter 77 to the output of corrector 79 then would otherwise occur between the input and output of filter 77. The signal is then passed through a shelving filter 80 and summed with the output of the filter 79 at node 83. A second shelving filter 81 is used to filter the summed signal and then to provide a final output signal on line 82. The distortion-cancellation filter of FIG. 2 operates in a manner described in conjunction with FIGS. 9 and 10 of U.S. Pat. No. 4,208,548, with the exception that the circuit of the mentioned patent describes elimination of distortion in a single frequency band from a single clipper. As is apparent with the present invention, distortion from a plurality of bands and from multiple clippers is cancelled. The distortion from a plurality of bands and multiple clippers can be cancelled in the circuit shown in FIG. 2 because this circuit is entirely linear; thus, superposition applies. Note the signal processing of each band need not use a clipper rather, for example, variable gain devices (such as a fast limiter) without memory as suggested at column 9, line 35 of U.S. Pat. No. 4,208,548 could be used.

ADDITIONAL CLIPPING WITH CIRCUIT OF FIG. 5

Figure 5:
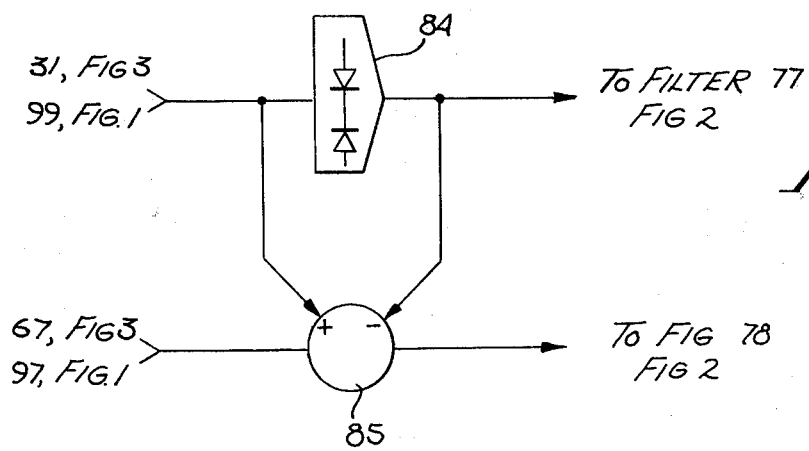
FIG. 5 illustrates a circuit which adds a wideband clipper with distortion cancellation to the outputs of the processor of FIGS. 1 and 3.

If it is desired to clip the output on line 31 of FIG. 3 to provide a more uniform peak level than provided by the summation of the various bands, then distortion-cancellation for this additional clipper can also be provided with the circuit of FIG. 5. The circuit of FIG. 5 is placed intermediate between the processor of FIG. 3 and the circuit of FIG. 2. Specifically, line 31 of FIG. 3 (or line 99 of FIG. 1) is coupled to the clipper 84. Similarly, line 67 of FIG. 3 (or line 97 of FIG. 1) is coupled to one terminal of the summer 85. The output of the clipper 84 is then coupled to filter 77 of FIG. 2 and the output of the summer 85 is coupled to filter 78 of FIG. 2. When this occurs, the distortion introduced by the clipper 84 is summed with the distortion signal from line 97 of FIG. 3 in a linear manner, and the sum of the distortion is applied to the distortion cancellation low-pass filter 78 of FIG. 2.

PROCESSOR OF FIG. 1

The circuit of FIG. 1 describes a computer optimized approximation of the circuit of FIG. 3 which achieves many of the benefits of the circuit of FIG. 3, however at a lower cost since it eliminates most of the corrective allpass networks.

Referring now to FIG. 1, the processor is again broken into two sections, a low frequency section and a high frequency section. The low frequency section is identical to the section of FIG. 1, except it includes one less band. Like numbers have been used in FIG. 1 to show the likeness between the low frequency sections of FIGS. 1 and 3. As was the case for FIG. 3, (for both the low frequency and high frequency sections), the clipper such as clippers 21 may be included before the summing node, that is, clipper 21 could be at the output of the compressor 37.

In the high frequency section, the input signal is first passed through the allpass filter 87 which filter has a center frequency of $f_1$. The output of this filter is passed through four parallel paths, 88 through 91. Path 88 includes a second order bandpass filter 95 which has cutoff frequencies of $f_2$ and $f_3$. As used in conjunction with the bandpass filters, "$f_2$", etc., has no precise mathematical definition, and is used to indicate the approximate frequency band covered by the filter. Precise decriptions of these bandpass filters can be obtained by specifying the location of their s-plane poles and zeros. The output of this filter is coupled to the compressor 96 and then to both clipper 98 and the bandpass filter 101. The output of the clipper 98 is passed through another bandpass filter 100. The outputs of filters 101 and 100 are summed on line 97, while the output of filter 100 is coupled to the line 99.

The paths 89 and 90 are the same as path 88 with the exception that the bandpass filters isolate different bands, for example, the band between $f_3$ and $f_4$ for path 89, and the band between $f_4$ through $f_5$ for path 90. The remaining path 91 is similar to the other paths except highpass filters are used as shown by filters 106, 107 and 108. Obviously, other bands may be included, however, the last band typically will include highpass filters to provide an upper frequency limit.

USE OF CIRCUIT OF FIG. 7 IN PROCESSOR OF FIG. 1

Figure 7:
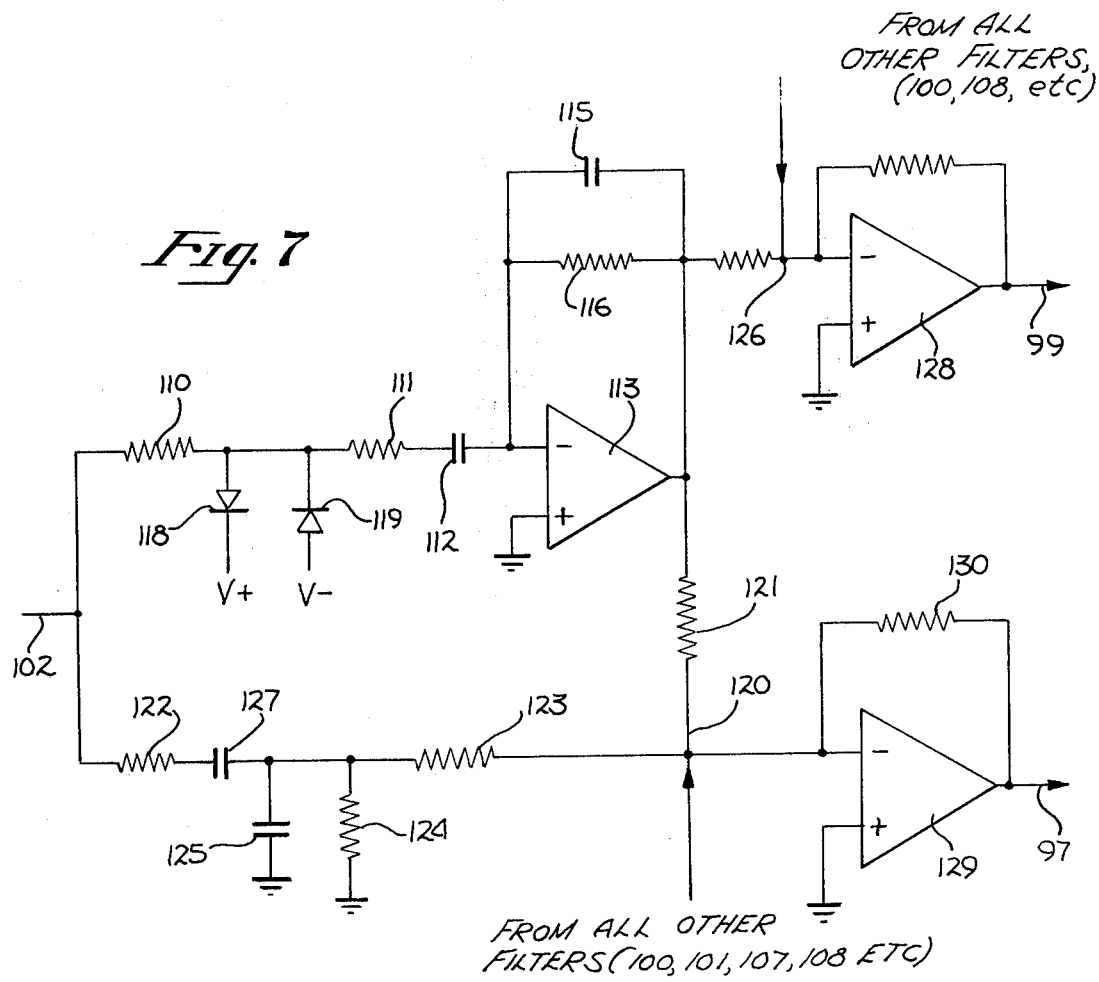
FIG. 7 is a circuit diagram of an economical circuit for realizing a single clipper with distortion cancellation for the multiband clipping arrangement of FIG. 1.

The portion of each of the paths shown, by way of example, within line 105 is realized with the circuit of FIG. 7, in the presently preferred embodiment. The signal on line 102 for path 89 is coupled through resistors 110 and 111 and capacitor 112 to the operational amplifier 113. Feedback for this amplifier is provided through the parallel combination of capacitor 115 and resistor 116. The diodes 118 and 119 perform the clipping function. The output of amplifier 113 is coupled to node 120 through resistor 121. This node also receives the input signal from line 102 through resistor 122, capacitor 127 and resistor 123. The junction between resistor 123 and capacitor 127 is coupled to ground through the parallel combination of resistor 124 and capacitor 125.

The amplifiers 128 and 129 are used for summing the signal from the other paths (88,90 and 91) at nodes 120 and 126 to provide the final signal on line 97 and 99, respectively.

The amplifier 113 along with resistors 110, 111 and 116 and capacitors 112 and 115 provide an inverting bandpass filter such as the filter 104 (or 100) of FIG. 1. The noninverting bandpass filter such as filter 103 is obtained through the passive components, resistors 122, 123 and 124 and capacitors 125 and 127.

The highpass filters within the path 91 may also be realized with the circuit of FIG. 7 by removing the capacitor 115 from the feedback path for the inverting bandpass filter and by removing the parallel combination of resistor 124 and capacitor 125 for the passive filter. Also, resistor 123 is bypassed.

The specific values of the resistors and capacitors in the circuit of FIG. 7 can be determined using well-known circuit synthesis techniques. In the event that the gains of the passive and active filters do not match, the value of resistor 121 can be selected to provide the desired overall gain and thus precise cancellation between the passive and active filters.

OPERATION OF PROCESSOR OF FIG. 1

As shown in FIG. 1, the presently preferred embodiment comprises a 6-band crossover system with embedded clippers and distortion cancellation. The low frequency section, as mentioned, is identical to that of FIG. 3 except that it contains one less band. The high frequency section is a general parallel structure in which the crossover filters are computer optimized to sum very nearly to flat (better than 0.25 dB) without the necessity for the additional allpass filters. The apparatus of FIG. 1 can therefore be called an "almost-allpass" crossover, in which the sum of the 6-bands (assuming equal gain from all compressors) is almost flat and where the input/output transfer function exhibits considerable phase shift.

Unlike the processor of FIG. 3, the processor of FIG. 1 contains two bands in the low frequency section and four in the high frequency section. This limits the bass to approximately 400 Hz. As discussed earlier, the peak output of the low frequency section below 400 Hz is constrained by clipper 21 to approximately 5 dB below the threshold of a final wideband clipper not illustrated. Distortion cancellation by the circuit of FIG. 2 is not used at these frequencies; distortion control is almost exclusively determined by the filters 17 and 23.

In the high frequency bands, the clipping distortion is rolled off at 6 dB/octave. Additionally, the clipping distortion below approximately 1.8 Kz is sharply cancelled by the circuit of FIG. 2. This is even true for the $f_2-f_3$ and $f_3-f_4$ bands where such a result is not expected since the main energy in these bands is below 1.8 Kz. However, listening tests have shown that the circuit of FIG. 2 causes a desirable reduction in "harshness" and "honkiness" (excess 2-3 kHz energy) when more difficult program material is processed. Under heavy clipping, this program material has some of its energy distributed into the distortion side chain, line 97 of FIG. 1. This redistributed energy is filtered by the filter 78 of FIG. 2 before being added back to the main signal path at node 83. In the presently preferred embodiment, where filter 15 has a cutoff frequency of approximately 1.8 kHz, this filter removes most of the "honk" energy, thus smoothing out the sound. (If the energy in bands $f_2-f_3$ and/or $f_3-f_4$ is low, little clipping occurs in clippers 94 and 98 of FIG. 1. Therefore, little energy is diverted to the side chain filter 78 of FIg. 2, and no audible reduction in "honk" energy occurs because such energy is not excessive under these conditions.)

In the presently preferred embodiment, for purposes of cost reduction, the cascade of filters 16 and 23 of FIG. 1 is not a Butterworth filter. Instead, this cascade is realized as the lowest set of five filters which have been computer-optimized for "almost flat" summation.

Assuming that all compressors have equal gains, it can be seen that the entire low frequency processor of FIG. 1 is equivalent to a third order lowpass filter with a cutoff frequency of $f_2$ in series with an allpass filter with a frequency of $f_1$. The insertion of the filter 87 of FIG. 1, in series with the four higher bands, adds a phase shift to these upper bands which matches the phase shift from the summation of filters 35, 11 and 17. This permits the output of filter 23 to be summed "almost flat" with the four high frequency bands. (Filters 16 and 23 in cascade form a third-order lowpass filter with frequency response at its cutoff frequency which is slightly peaked by comparison to a Butterworth filter. This filter is the lowpass analog of highpass filters 106 and 107, and is designed such that when its output is summed with the three bandpass and one highpass paths of the high frequency section of FIG. 1, maximally flat summed response is obtained. The low frequency section of FIG. 1 is essentially achieved by having filters 16 and 23 further divided into two bands by means of filters 11, 17 and 35. These filters are equivalent, after summation, to a single allpass filter, which is matched by allpass filter 87. The basic structure of FIG. 1 thus has five bands, which are computer optimized to sum "almost allpass". A sixth band is obtained by splitting the lowest band (filters 16 and 23) into two bands by use of an elementary allpass crossover cascaded with this lowest band.)

It should be noted that the clippers are embedded in a somewhat different manner for the upper bands of FIG. 1 when compared to the high frequency section of FIG. 3. As is apparent, the upper four bands are in a true parallel arrangement. The selectivity to drive the compressors in these bands is provided by the second order bandpass filters preceding the compressors and highpass filter 106 in the case of the highest frequency band. These filters are symmetrical in the case of the bandpass filters (that is, they have equal highpass and lowpass slopes) and provide proper selectivity for driving the compressors. The bandpass filters such as filter 100, or the highpass filter 108 are located after the clippers and roll off the out-of-band distortion components as in the case of FIG. 3. With the bandpass filters, rolloff occurs for both the low frequency and high frequency clipper distortion. These 6 dB/octave rolloff characteristics are not always adequate for to eliminate audible intermodulation when heavy clipping occurs, such as with sibilance. However, with the distortion cancellation filter of FIG. 2, the effective highpass filtering is improved from 6 dB/octave to approximately 36 dB/octave. The distortion-cancellation requires that the 6 dB/octave filters in each band such as filters 100 and 101 have matched, inverting characteristics. That is, the filters (ignoring the polarity reversal) have substantially identical amplitude and phase response. Therefore, if the clipper 98 is not active, the output of filters 100 and 101 will cancel once summed on line 97 and no signal will appear on this line. If the clipper does conduct, then only the clipper-induced distortion will be present on line 97 because the signal on line 97 is equivalent to the difference between the clipper's input and its output, the difference being filtered by a filter equivalent to 100 or 101. The main signal on line 99 has been filtered identically (in filter 100); thus, complete cancellation can take place within the circuit of FIG. 2.

Thus, an economical multiband compressor (FIG. 1) has been described which includes multiband clipping and distortion cancellation. By the use of relatively simple parallel topography which provides a computer-optimized summing of the crossover filters, the complex allpass equalizer networks required for the embodiment of FIG. 3 are substantially eliminated.

I claim:

1. A multiband processor for processing an input signal comprising:
   a first and a second lowpass filter, each having approximately a first cutoff frequency;
   a first signal processing means for processing a signal, coupled between said first and second filters to receive the output of said first filter;
   a third highpass filter having a cutoff frequency approximately equal to said first frequency coupled to said first filter;
   a second signal processing means for processing a signal coupled to said third filter;
   first combining means for combining the outputs of said second filter and said second signal processing means;
   a fourth and a fifth lowpass filter each having approximately a second cutoff frequency different than said first frequency, said fourth and fifth filters being coupled in series with said first and second filters, said fourth filter being coupled to the inputs of said first and third filters, the output of said first combining means being coupled to the input of said fifth filter, and said fourth filter being coupled to receive said input signal;
   a sixth highpass filter having a cutoff frequency approximately equal to said second frequency, coupled to said fourth filter;
   a seventh allpass filter having phase response approximately matching the phase response of the summation of said first, second, and third filters coupled to said sixth filter; and
   second combining means for combining the signal from said sixth and seventh filters with the output signal from said fifth filter;
   whereby efficient multiband signal processing is achieved at the output of said second combining means.

2. The multiband processor defined by claim 1 including an additional loop comprising:
   an eighth and a ninth lowpass filter each having approximately a third cutoff frequency different than said first and second frequencies, said eighth and ninth filters being coupled in series with said first and second filters said eighth filter coupled to receive said input signal before said input signal is coupled to said fourth filter;
   a tenth highpass filter having a cutoff frequency approximately equal to said third frequency, said tenth filter being coupled to the output of said eighth filter; and
   an eleventh allpass filter having a phase response approximately matching the summation of phase responses of said seventh filter and the summation of said fourth, fifth and sixth filters, said eleventh filter being coupled to said tenth; and, third combining means for combining the signals from said ninth and eleventh filters.

3. The multiband processor defined by claim 2 including a third signal processing means for processing a signal, coupled in series with said sixth and seventh filters and an additional signal processing means for processing a signal coupled into said additional loop.

4. The multiband processor defined by claim 1 wherein said first signal processing means includes a first clipper.

5. The multiband processor defined by claim 4 wherein said first signal processing means includes a first compressor coupled in series with said first clipper.

6. The multiband processor defined by claim 5 wherein said second signal processing means includes a second compressor and a second clipper.

7. The multiband processor defined by claim 6 wherein said second clipper receives the output of said first combining means.

8. The multiband processor defined by claim 1 wherein one of said first and second filters is realized as the simple pole of a third-order Butterworth lowpass filter and the other of said first and second filters is realized as the complex pole of a third-order Butterworth lowpass filter and wherein said third filter is realized as a third order Butterworth highpass filter.

9. A multiband processor for processing an input signal comprising:

a first and a second highpass filter, each having approximately a first cutoff frequency;

a first signal processing means for processing a signal, coupled between said first and second filters coupled to receive the output of said first filter;

a third lowpass filter having a cutoff frequency approximately equal to said first frequency coupled to said first filter;

a second signal processing means for processing a signal coupled to the output of said third filter;

first combining means for combining the outputs of said second filter and said second signal processing means;

a fourth and a fifth highpass filter each having approximately a second cutoff frequency different than said first frequency, said fourth and fifth filters being coupled in series with said first and second filters, said fourth filter being coupled to the input of said first and third filters, the output of said first combining means being coupled to the input of said fifth filter, and said fourth filter being coupled to receive said input signal;

a sixth lowpass filter having a cutoff frequency approximately equal to said second frequency, coupled to said fourth filter, a seventh allpass filter having a phase response approximately matching the phase response of the summation of said first, second and third filters coupled to said sixth filter; and, second combining means for combining the signal from said sixth and seventh filters with the signal from the output of said fifth filter;

whereby efficient multiband signal processing is achieved at the output of said second combining means.

10. The multiband processor defined by claim 9 including an additional loop comprising:

an eighth and a ninth highpass filter each having approximately a third cutoff frequency different than said first or second frequencies, said eighth and ninth filters being coupled in series with said first and second filters;

a tenth lowpass filter having a cutoff frequency approximately equal to said third frequency, said tenth filter being coupled to said eighth filter;

an eleventh allpass filter having a phase response approximately matching the phase responses of said summation of the seventh filter and the summation of said fourth, fifth and sixth filters, said eleventh filter being coupled to said tenth filter; and, third combining means for combining the signal from said tenth and eleventh filters with the signal from said ninth filter.

11. The multiband processor defined by claim 10 including a third signal processing means for processing a signal, coupled in series with said sixth and seventh filters and an additional signal processing means for processing a signal coupled into said additional loop.

12. The multiband processor defined by claim 9 wherein said first signal processing means includes a first clipper.

13. The multiband processor defined by claim 12 wherein said first signal processing means includes a first compressor coupled in series with said first clipper.

14. The multiband processor defined by claim 13 wherein said second signal processing means includes a second compressor and a second clipper.

15. The multiband processor defined by claim 14 wherein said second clipper receives the output of said first combining means.

16. The multiband processor defined by claim 9 wherein one of said first and second filters is realized as the simple pole and zero of a third-order Butterworth highpass filter and the other of said first and second filters is realized as the complex pole and double zero at the origin of a third-order Butterworth highpass filter; and wherein said third filter is realized as a third order Butterworth lowpass filter.

17. The multiband processor defined by claim 14 including additional circuit means for subtracting the output of each of said clippers from said clipper input, and for combining the resulting difference signals.

18. A multiband processor for processing an input signal comprising:

a first and second lowpass filter each having a cutoff frequency approximately equal to a first frequency;

a first signal processing means for processing a signal, said first signal processing means being coupled between said first and second filters;

a third highpass filter, said third filter having a cutoff frequency approximately equal to said first frequency, said third filter being coupled to the input of said first filter and to said second filter;

a second signal processing means for processing a signal, said second signal processing means coupled to said third filter;

a first combining means for combining a signal from said third filter with a signal from said second filter;

a fourth and a fifth lowpass filter each having a cutoff frequency approximately equal to a second frequency, the output of said fourth filter being coupled to the input of said first filter and the input of said fifth filter being coupled to said first combining means the input to said fourth filter being coupled to receive said input signal;

a sixth allpass filter having a center frequency approximately equal to said first frequency, coupled to receive said input signal;

a plurality of generally parallel signal processing paths for providing high frequency audio processing each being coupled to the output of said sixth filter, the signal from said paths being combined with the output of said fifth filter, whereby said first through fifth filters and said first and second signal processing means provide low frequency processing for an audio signal, while said parallel paths provide high frequency processing for said audio signal 19. The multiband processor defined by claim 18 wherein one of said parallel paths comprises:

a seventh bandpass filter having one cutoff frequency approximately equal to said second frequency and the other cutoff frequency equal to a third frequency, said seventh filter coupled to said sixth filter;

a third signal proccessing means for processing an audio signal coupled to the output of said seventh filter; and, an eighth bandpass filter having approximately the same cutoff frequencies as said seventh filter, said eighth filter coupled in series with said third signal processing means.

20. The multiband processor defined by claim 19 including a ninth bandpass filter having approximately the same cutoff frequencies as seventh and eighth filters, said ninth filter being coupled to said third signal processing means, with the outputs of said eighth and ninth filters being combined.

21. The multiband processor defined by claim 20 wherein said first signal processing means includes a compressor and a clipper.

22. An audio signal processor for processing an input analog audio signal comprising:

a low frequency processor coupled to receive said input audio signal;

an allpass filter coupled to receive said input audio signal;

a high frequency processor coupled to the output of said allpass filter;

said high frequency processor comprising a plurality of generally parallel paths each of said paths including:

a first bandpass filter coupled to receive the output of said allpass filter;

a compressor coupled to the output of said first bandpass filter;

a second bandpass filter coupled to the output of said compressor;

a clipper coupled to receive the output of said compressor and, a third inverting bandpass filter coupled to receive the output from said clipper, whereby efficient multiband signal processing is achieved.

23. The processor defined by claim 22 including a second bandpass filter coupled to the output of said compressor.

24. The processor defined in claim 23 wherein an additional parallel path is used which includes highpass filters.

25. The processor defined in claim 24 wherein the output from said second and third filters are summed on a first line and wherein the output from said third filter is coupled to a second output line.

26. The processor defined in claim 25 wherein said first and second output lines are coupled to a distortion cancellation circuit.

27. In an audio processor for processing an input audio signal, an improvement comprising:

a plurality of generally parallel paths for processing said input signal each of which includes:

a first bandpass filter coupled to receive said input signal;

a compressor coupled to the output of said first bandpass filter;

a second bandpass filter coupled to the output of said compressor;

a clipper coupled to receive the output of said compressor;

a third bandpass filter coupled to receive the output of said clipper;

combining means for combining the output of said second and third filters;

whereby an effective multiband processor is realized.

28. The improvement defined by claim 27 including an additional parallel path which includes highpass filters.

29. An audio signal processing system for processing an input signal comprising:

a multiband processor for processing bands of said audio signal, said multiband processor including a plurality of signal processing means for processing audio signals each comprising a compressor and clipper, each of said processing means being associated with a different one of said bands and being coupled to receive said input signal;

distortion determining means for providing a signal representative of the distortion introduced by said signal processing means, said distortion determining means being coupled to said multiband processor; and, a distortion cancellation means for cancelling the distortion introduced by said signal processing means, said distortion cancelling means being coupled to receive an output signal of said multiband processor and being coupled to receive said signal representative of said distortion;

whereby multiband distortion is reduced.

30. The processing system defined by claim 29 wherein said distortion cancelling means comprises:

a first lowpass filter coupled to receive said signal representative of said distortion; and, combining means for combining the output of said first lowpass filter with said output of said multiband processor.

31. The processing system defined by claim 30 wherein said distribution cancellation means includes a second lowpass filter coupled to receive said output of said processor, the output of said second filter being coupled to said combining means.

32. The processing system defined by claim 30 wherein said distortion cancellation means includes a phase corrector coupled to receive said output of said processor, the output of said corrector being coupled to said combining means.

33. The processing system defined by claim 30 including a second lowpass filter and a phase corrector coupled between said processor and said combining means for receiving said output of said processor.

34. The processing system defined by claim 33 including a third shelving filter coupled between said second filter and phase corrector, and said combining means, and a fourth shelving filter coupled to the output of said combining means.

35. The processing system defined by claim 34 wherein said third and fourth shelving filters have complementary characteristics.

36. The processing system defined by claim 35 wherein said signal processing means include clippers.

* * * * *